United States Patent [19]

Yang

[11] Patent Number: 5,366,918

[45] Date of Patent: Nov. 22, 1994

[54] METHOD FOR FABRICATING A SPLIT POLYSILICON SRAM CELL

[75] Inventor: Ming-Tzong Yang, Hsin Chu, Taiwan, Prov. of China

[73] Assignee: United Microelectronics Corporation, Hsinchu, Taiwan, Prov. of China

[21] Appl. No.: 192,366

[22] Filed: Feb. 7, 1994

[51] Int. Cl.⁵ ............................................. H01L 21/70
[52] U.S. Cl. ........................................ 437/52; 437/47; 437/51; 437/60; 437/48
[58] Field of Search .................. 437/47, 51, 52, 57, 437/60, 48, 49; 451/52

[56] References Cited

U.S. PATENT DOCUMENTS

| | | | |
|---|---|---|---|
| 4,910,576 | 3/1990 | Campbell et al. | 357/59 |
| 5,079,611 | 1/1992 | Ikeda et al. | 357/41 |
| 5,132,240 | 7/1992 | Shimomura et al. | 437/47 |
| 5,270,243 | 12/1993 | Tuan et al. | 437/60 |
| 5,272,103 | 12/1993 | Nakamura | 437/60 |

*Primary Examiner*—Brian E. Hearn
*Assistant Examiner*—Tuan Nguyen
*Attorney, Agent, or Firm*—George O. Saile; Graham S. Jones, II

[57] ABSTRACT

An SRAM semiconductor device comprises a first layer, a second layer and a third layer of polysilicon are separated by dielectric layers formed on a substrate, and a split gate structure with transistors formed in different polysilicon levels. Preferably, the split gate structure includes pull down transistors and pass gate transistors formed in different polysilicon levels; the second polysilicon layer extends into contact with the substrate; the second polysilicon layer contacts the third polysilicon layer in an interconnection region; and the third polysilicon layer comprises a polysilicon load resistor.

10 Claims, 4 Drawing Sheets

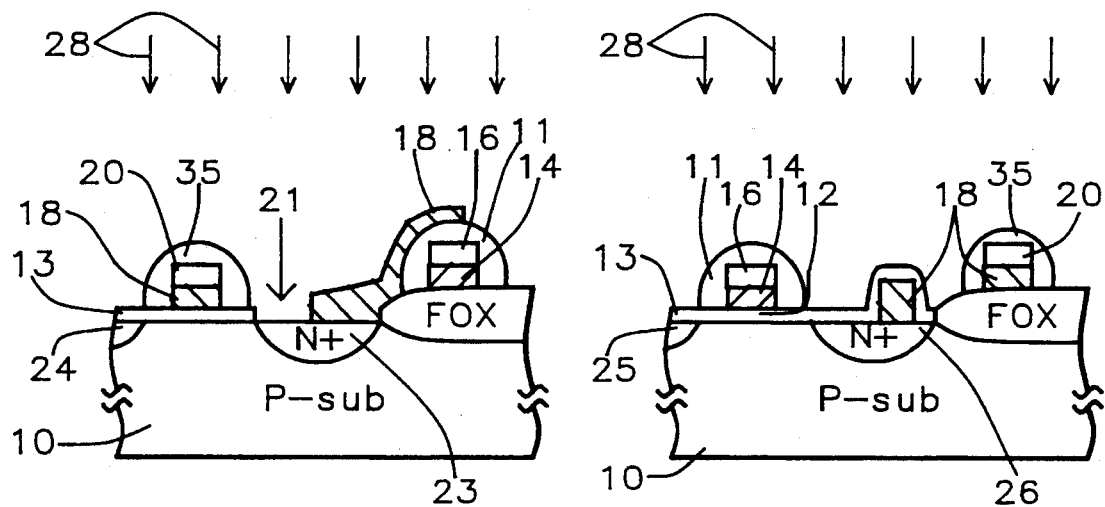
*FIG. 4A*   *FIG. 4B*
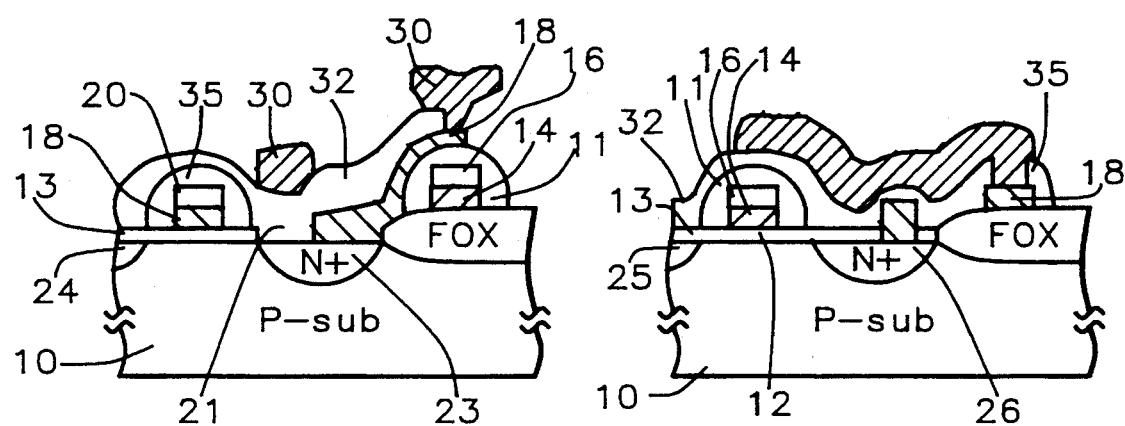
*FIG. 5A*   *FIG. 5B*

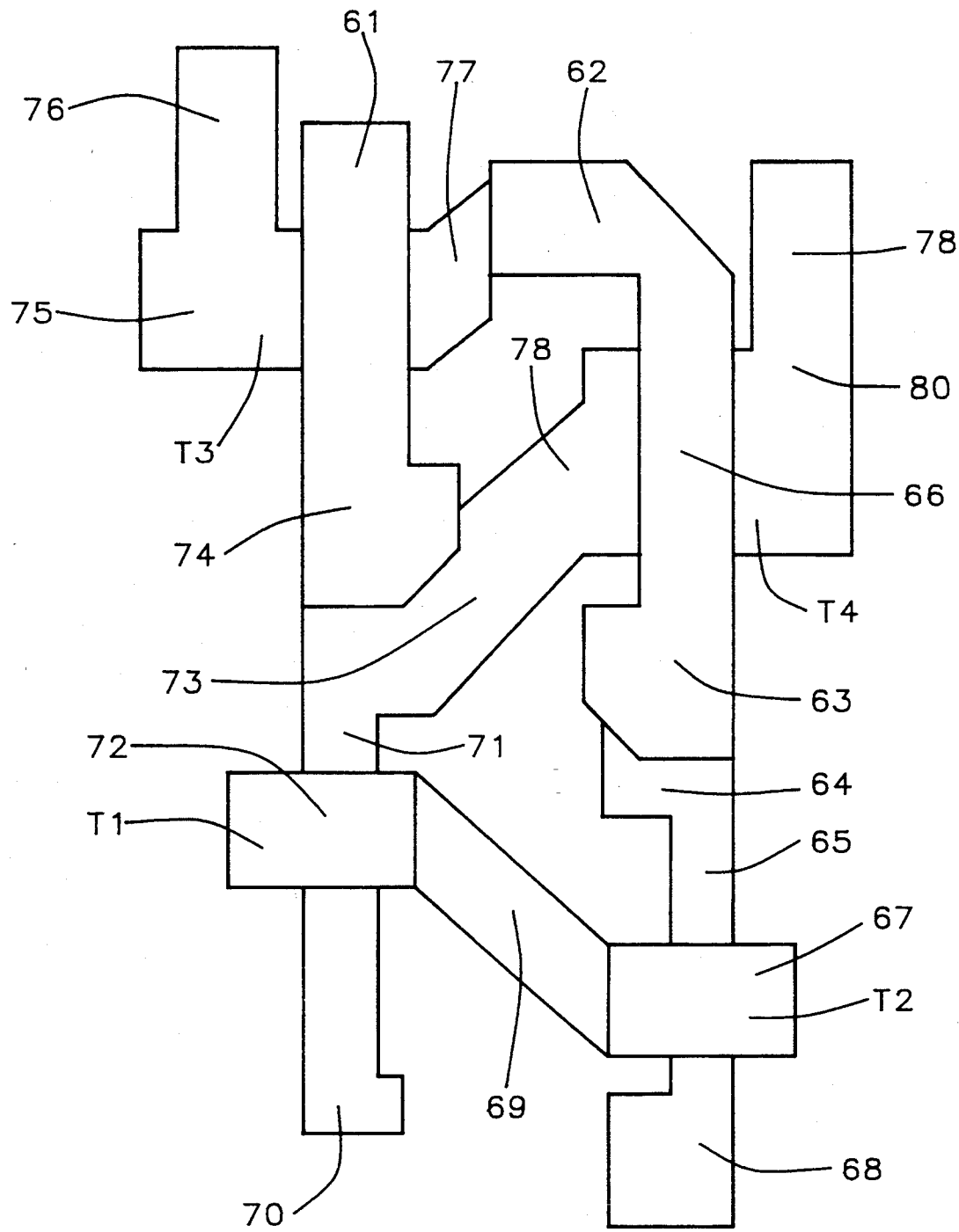
FIG. 6 - Prior Art

METHOD FOR FABRICATING A SPLIT POLYSILICON SRAM CELL

BACKGROUND OF THE INVENTION

1. Field of the Invention

This invention relates to semiconductor memory devices and more particularly to small symmetrical SRAM devices.

2. Description of Related Art

U.S. Pat. No. 4,910,576 of Campbell et al for "Memory Cell" shows an SRAM layout without a split polysilicon structure.

U.S. Pat. No. 5,079,611 of Ikeda et al "Semiconductor Integrated Circuit Device and Process for Fabricating the Same" describes an SRAM integrated circuit layout structure, without a split-polysilicon device structure.

In the past integrated circuit SRAM cells have been relatively large in size.

Smaller cells will have the advantage first that the small chip size provides a lower cost and the smaller devices perform at higher speed.

In addition they have had the disadvantage of being asymmetric which is a disadvantage because it is more difficult to provide memory cell stability and provide sense amplifier design.

SUMMARY OF THE INVENTION

A method in accordance with this invention and a semiconductor device fabricated by the method in accordance with this invention comprises a) applying a first dielectric layer to a silicon substrate, b) formation of a first polysilicon layer on the silicon first dielectric layer, c) applying a second dielectric layer to the first polysilicon layer, d) forming a first polysilicon masking layer on the surface of the substrate, e) etching the first polysilicon layer and the second dielectric layer through openings in the first masking layer, f) forming a third dielectric layer over the remaining portions of the first polysilicon layer, and then performing a spacer etch and forming a fourth dielectric layer, g) forming a buried contact masking layer on the surface of the device, h) etching the first dielectric layer down to form buried contact openings to the substrate for a buried contact through openings in the first buried contact masking layer, i) formation of a second polysilicon layer on the device extending down into the buried contact openings into contact with the substrate, j) forming a fifth dielectric layer over the second polysilicon layer, k) forming a second polysilicon masking layer on the surface of the substrate, l) etching the second polysilicon layer and the fifth dielectric layer through openings in the second polysilicon masking layer, m) forming a sixth dielectric layer over the remaining portions of the second polysilicon layer, n) implanting dopant ions of a source/drain mask through a source drain mask in regions in the substrate, o) formation of a seventh dielectric layer, p) formation of via openings in the sixth dielectric layer down to the first dielectric layer in one section and down to the second polysilicon layer in another area, q) formation of a third polysilicon layer on the device extending down into the via openings into contact with the first dielectric layer, r) forming a third polysilicon masking layer on the surface of the third polysilicon layer, and s) etching the third polysilicon layer to form a predetermined configuration through the third polysilicon masking layer.

Preferably, the first dielectric layer comprises a gate oxide layer; the second dielectric layer comprises a silicon dioxide layer applied by chemical vapor deposition; the third dielectric layer comprises a silicon dioxide layer; the fourth dielectric layer comprises a second gate oxide layer; the fifth dielectric layer comprises a silicon dioxide layer applied by chemical vapor deposition; the sixth dielectric layer comprises a silicon dioxide layer; and the seventh dielectric layer comprises a third gate oxide layer.

An SRAM semiconductor device comprising a) a first layer, a second layer and a third layer of polysilicon are separated by dielectric layers formed on a substrate, and b) a split gate structure with transistors formed in different polysilicon levels.

Preferably, the second polysilicon layer extends into contact with the substrate; the second polysilicon layer contacts the third polysilicon layer in an interconnection region; the third polysilicon layer comprises a polysilicon load resistor.

Preferably, the split gate structure includes pull down transistors and pass gate transistors formed in different polysilicon levels; the second polysilicon layer extends into contact with the substrate; the second polysilicon layer contacts the third polysilicon layer in an interconnection region; and the third polysilicon layer comprises a polysilicon load resistor.

BRIEF DESCRIPTION OF THE DRAWINGS

The foregoing and other aspects and advantages of this invention are explained and described below with reference to the accompanying drawings, in which:

FIGS. 4A and 4B show the products of FIGS. 3A and 3B after an etching process, as well as N+ source/drain implanting of arsenic ions.

FIGS. 5A and 5B show the products of FIGS. 4A and 4B with a gate oxide layer formed, VIAS etched and a polysilicon 3 layer deposited in preparation for a thin film transistor (TFT) in accordance with this invention.

FIG. 6 shows a plan view of a prior art SRAM device.

DESCRIPTION OF THE PREFERRED EMBODIMENT

Figure 1A:
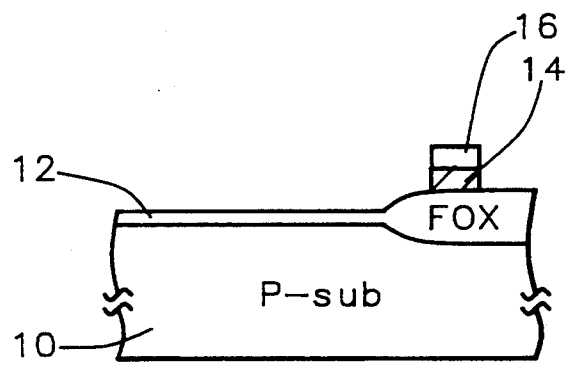
FIGS. 1A and 1B show a pair of sectional views of a semiconductor device are shown taken along lines A—A and B—B in FIG. 5.
Figure 1B:
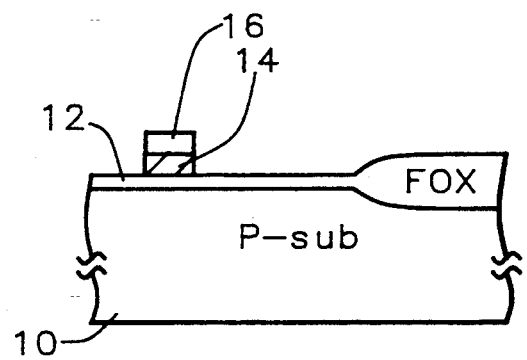

Referring to FIGS. 1A and 1B a pair of sectional views of a semiconductor device are shown taken along lines A—A and B—B in FIG. 5.

Gate oxide 1 layer 12 is formed on semiconductor substrate 10 by the process of thermal growth in a furnace chamber within the temperature range from about 700° C. to about 1,000° C. and within a pressure range from about 1 mTorr to about 1,000 Torr.

A polysilicon 1 layer 14 is deposited upon gate oxide layer 12 and the FOX areas, followed by conventional doping. The polysilicon is deposited by the process of LPCVD (Low Pressure Chemical Vapor Deposition) within a pressure range from about 0.1 mTorr to about 100 Torr at a temperature from about 500° C. to about 750° C.

The doping is performed by $POCl_3$ or implantation at a doping level from about 1E 17cm$^{-3}$ to about 1E 22cm$^{-3}$.

A silicon dioxide layer 16 is deposited by chemical vapor deposition (CVD) upon polysilicon 1 layer A polysilicon 1 photoresist mask (not shown) is formed (by depositing photoresist which is then exposed to a pattern and developed) upon silicon dioxide layer 16 for etching of silicon dioxide layer 16 and the polysilicon 1 layer 14 layer as well in order to pattern layer 14.

The silicon dioxide layer 16 is etched by CVD through the mask Just formed in the preceding step. The etching process uses an etching process selected from RIE and plasma etching in a plasma chamber within the RF power range from about 100 watts to about 1,500 watts and within a pressure range from about 1 mTorr to about 100 Torr The polysilicon 1 layer 14 is then etched through the mask using plasma etching in a plasma chamber within the RF power range from about 50 watts to about 1,500 watts and within a pressure range from about 1 mTorr to about 100 Torr.

Figure 2A:
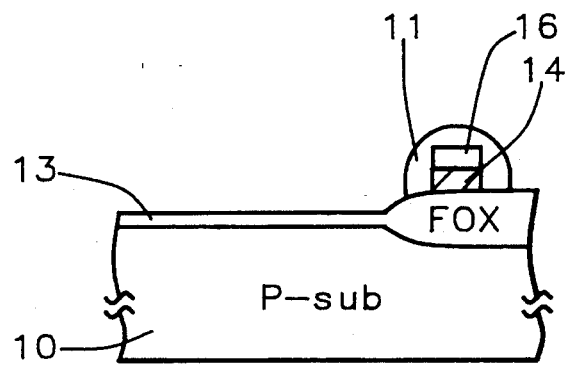
FIGS. 2A and 2B show sectional views of a set of silicon dioxide structures formed over stacked polysilicon 1/silicon dioxide structures processed in accordance with this invention.
Figure 2B:
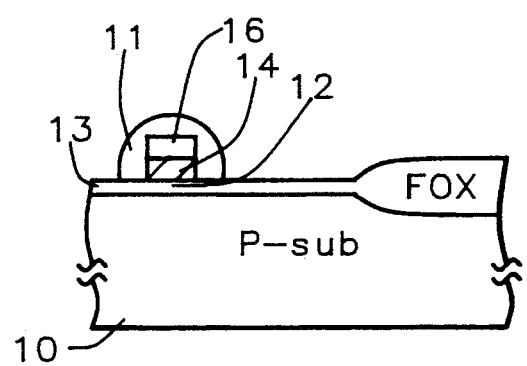

The remaining silicon dioxide layer 16 in FIGS. 1A and 1B on the surface of the structures 14 is covered with the silicon dioxide layer 11 as shown in FIGS. 2A and 2B. Thee silicon dioxide layer 16 and silicon dioxide layer 11 are similar films, so silicon dioxide layer 16 is treated in combination with layer 11 in the etching step which follows.

Referring to FIGS. 2A and 2B, a new set of silicon dioxide structures are shown to have been formed over the stacked polysilicon 1 14/silicon dioxide 16 structures.

Silicon dioxide layer 11 is deposited by the process of APCVD, PECVD, LPCVD, PETEOS or CPTEOS by a conventional CVD oxide deposition process under conventional conditions. This is a blanket deposition.

Layer 11 is etched leaving the structures as shown in FIGS. 2A and 2B. The etching process uses an etching process selected from RIE and plasma etching in a plasma chamber within the RF power range from about 100 watts to about 1,500 watts and within a pressure range from about 1 mTorr to about 100 Torr.

Figure 3A:
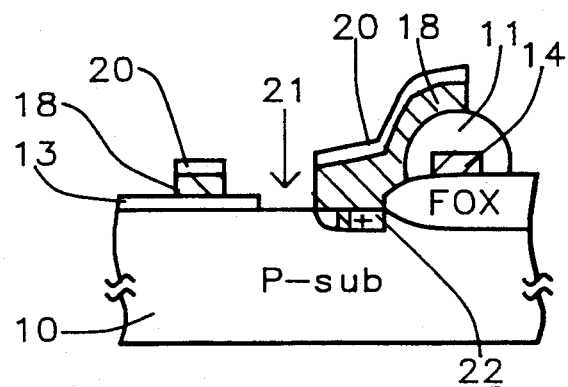
FIGS. 3A and 3B show the products of FIGS. 2A and 2B processed further in accordance with the process of this invention.
Figure 3B:
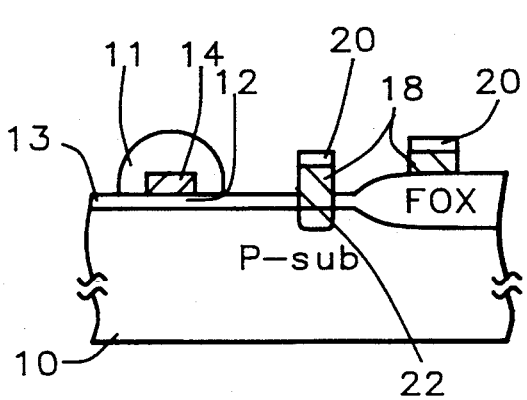

Referring to FIGS. 3A and 3B, the products of FIGS. 2A and 2B are processed in accordance with the steps which follow.

Then the gate oxide 1 layer 12 is removed in the areas without polysilicon 1 layer 14. Next, a gate oxide 2 layer 13 is formed by the same process employed to deposit gate oxide 1 layer 12.

The gate oxide 1 layer 12 remains under under polysilicon 1 layer 14. On the other hand the gate oxide 2 layer 13 is found under the polysilicon 2 structure 18 in FIG. 3A.

A mask not shown is formed for a buried contact. (The mask is formed by depositing photoresist which is then exposed to a pattern and developed.)

The buried contact is etched using an etchant of RIE or plasma in a plasma chamber within the RF power range from about 50 watts to about 1500 watts and within a pressure range from about 1 mTorr to about 100 Torr.

Polysilicon 2 layer 18 is deposited and doped. The polysilicon layer 18 is deposited by the same CVD process employed for the polysilicon 1 layer. The doping is performed by the same process employed for the polysilicon 1 layer 14, i.e. doping by $POCl_3$ or implantation at a doping level from about 1E 17cm$^{-3}$ to about 1E 22cm$^{-3}$.

A silicon dioxide layer 20 is deposited by chemical vapor deposition (CVD) upon the polysilicon 2 layer 18.

A photoresist polysilicon 2 mask (not shown) is formed (by depositing photoresist which is then exposed to a pattern and developed) upon oxide layer 20 for etching of layer 20 and the polysilicon 2 layer 18 layer as well in order to pattern layer 18.

The oxide layer 20 is etched by CVD through the mask just formed in the preceding step. The etching process used is the same etching process employed for etching the oxide layer 16.

The polysilicon 2 layer 18 is then etched using the same process as etching of the polysilicon 1 layer 14.

Referring to FIGS. 4A and 4B, the source and the drain ion implantation process is performed on the products of FIGS. 3A and 3B.

Silicon dioxide layer 35 is formed by the same deposition process employed to form the silicon dioxide layer 11.

Layer 35 is etched in a "spacer etch 2" leaving the structures as shown in FIGS. 4A and 4B. The etching process uses the same etching process as that employed to etch the silicon dioxide layer 11.

An N+ source/drain masking step is formed by means of conventional lithography with an N+ S/D (source/drain) mask.

An N+ source/drain implant is provided using ions 28 of arsenic with a dose of between about 1E 14 cm$^{-2}$ and about 2 E 16 cm$^{-2}$ with an energy of between about 30 keV and about 120 keV, with the implanted dopant reaching a depth of between about 1000Å and about 4000Å. The ions 28 are driven into the device by heating at a temperature from about 700° C. to about 950° C. from between 5 minutes and 120 minutes in a furnace. Alternatively, ions 28 are driven into the device by heating at a temperature from about 700° C. to about 1100° C. from between 10 minutes and 200 minutes by using a RTA (Rapid Thermal Annealing) process.

Referring to FIGS. 5A and 5B, a gate oxide layer 32 is formed, VIAS are etched and a polysilicon 3 layer 30 is deposited in preparation for a thin film transistor (TFT) in accordance with this invention.

In particular gate oxide 3 layer 32 is formed for a thin film transistor (TFT) by the process of thermal oxidation in a furnace at from about 700° C. to about 1100° C., or CVD oxide in an APCVD, LPCVD, or PECVD chamber forming a layer 32 having a thickness of from about 100Å to about 1000Å.

Note that this cell can be also be used for application as a polysilicon load. For such a polysilicon load application, silicon dioxide layer 32 is an insulation between polysilicon layers.

Polysilicon load cells and TFT cells have the same cell size layout but they have different thicknesses of gate oxide 3 layer 32 and different doping of polysilicon 3 layer 30.

A mask for forming VIAS in gate oxide layer 32 is formed (by coating with photoresist which is then exposed to a pattern and developed, by a conventional lithography process) upon oxide layer 32 for etching of layer 32 in order to form via openings.

The VIAS are etched through the mask using an etchant of RIE or plasma in a plasma chamber within the RF power range from about 100 watts to about 1,500 watts and within a pressure range from about 1 mTorr to about 100 Torr.

A blanket deposition of polysilicon 3 layer 30 is then performed and a doping process follows. The polysilicon 3 layer 30 is deposited upon the gate oxide 3 layer 32, followed by conventional doping. The polysilicon is deposited by the process of LPCVD using the same process as that employed for polysilicon 1 and polysilicon 2 layers 14 and 18. That is, the polysilicon 3 layer 30 is deposited by the process of LPCVD (Low Pressure Chemical Vapor Deposition) within a pressure range from about 0.1 mTorr to about 100 Torr at a temperature from about 500° C. to about 750° C.

The doping is performed by implantation with a mask to separate the interconnection and the channel of the TFT or polysilicon load of the polysilicon load cell.

A photoresist polysilicon 3 mask (not shown) is formed (by depositing photoresist which is then exposed to a pattern and developed) on the polysilicon 3 layer 30 for etching thereof in order to pattern the polysilicon 3 layer.

The polysilicon 3 (TFT) layer 30 is then etched through the mask using the same process used to etch the polysilicon 1 layer 14. That is the layer 30 is etched through the mask using plasma etching in a plasma chamber within the RF power range from about 50 watts to about 1,500 watts and within a pressure range from about 1 mTorr to about 100 Torr.

FIG. 6 shows a plan view of prior art SRAM device. The elements of a device include pass transistor T1 which includes source 70, drain 71, and gate 72.

Pass transistor T2 includes drain 65, gate 67, and source 68 of transistor T2. The diffusion area 64 connects the interconnection 63 and the drain 65 of transistor T2.

Pull down transistor T3 includes gate 61, the source 75, and drain 77.

Pull down transistor T4 includes gate 66, drain 78 and source 80.

Word line 69 connects the gates 67 and 72 of pass transistors T1 and T2.

Interconnection 62 connects the gate 66 of pull down transistor T4 and the drain 77 of transistor T3.

Interconnection 63 connects the gate 66 of transistor T4 and the drain 65 of transistor T2.

Interconnection 73 connects the drain 71 of transistor T1 and the drain 78 of transistor T4.

The interconnection 74 connects the drain 71 of transistor T1 and the gate 61 of pull down transistor T3.

A diffusion area 76 for opening the contact for connecting the source 75 of transistor T3 and a ground line (not shown.)

The diffusion area 78 for opening the contact for connecting the source 80 of transistor T4 and the ground line (now shown.) For convenience of explanation, a polysilicon load or transistor TFT which is to be employed in connection with this invention is not shown for the conventional cell because this is only tangentially related to the subject matter of this invention.

Figure 7:
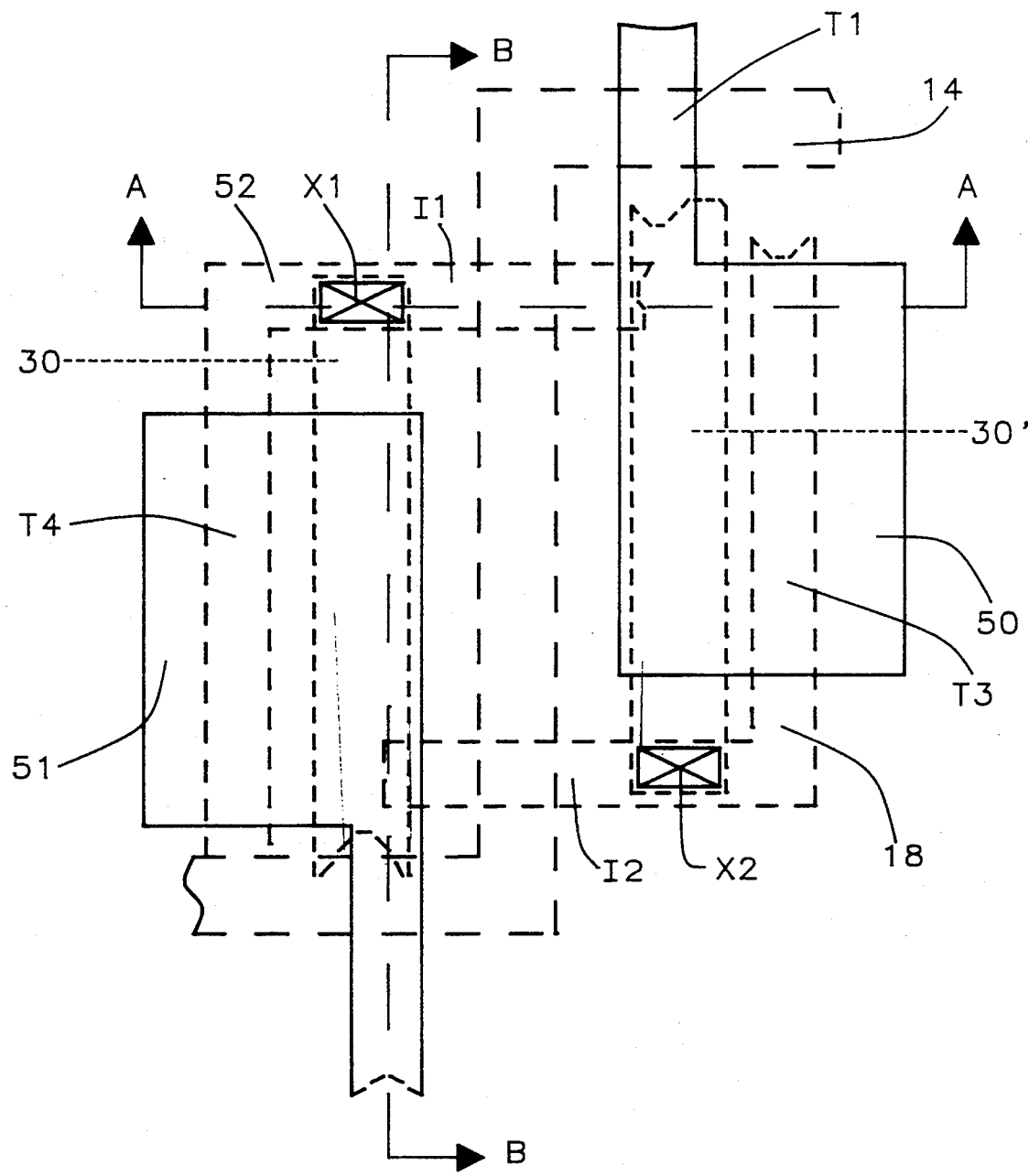
FIG. 7 is a plan view of a device in accordance with this invention.

FIG. 7 is a plan view of a device in accordance with this invention. An important aspect of this invention is that the plan view in FIG. 7 is symmetric whereas the prior art plan view as shown in FIG. 6 is asymmetric. Referring to FIG. 7, the two interconnection lines I1 and I2 shown there are composed of the same polysilicon 2 layer and the same layout so that the resistance thereof is the same. In conventional cell in FIG. 6 interconnection 73 and interconnection 74 connect the drain 78 of transistor T4 and the gate 61 of transistor T3. Diffusion layers 63 and 66 connect the drains of T3 and the gate of T4 which is a different layout and a complicated structure.

The pass transistor and the pull down transistor are defined by different polysilicon layers so node interconnections can be defined by the same layers (polysilicon same as pulldown transistor.) Between the different polysilicon layers, the size of the cell in accordance with his invention is smaller than the conventional cell by about 20% to about 40%.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of fabrication of an semiconductor device comprising
 a) applying a first dielectric layer to a silicon substrate,
 b) forming a first polysilicon layer on said first dielectric layer,
 c) applying a second dielectric layer to said first polysilicon layer,
 d) forming a first polysilicon masking layer on the surface of said substrate,
 e) etching said first polysilicon layer and said second dielectric layer through openings in said first masking layer,
 f) forming a third dielectric layer over the remaining portions of said first polysilicon layer, and then performing a spacer etch for forming a fourth dielectric layer,
 g) forming a buried contact masking layer on the surface of said device,
 h) etching said first dielectric layer down to form buried contact openings to said substrate for a buried contact through openings in said first buried contact masking layer, forming a second polysilicon layer on said device extending down into said buried contact openings into contact with said substrate, j) forming a fifth dielectric layer over said second polysilicon layer, k) forming a second polysilicon masking layer on the surface of said substrate, l) etching said second polysilicon layer and said fifth dielectric layer through openings in said second polysilicon masking layer, m) forming a sixth dielectric layer over the remaining portions of said second polysilicon layer, n) implanting dopant ions of a source/drain mask through a source drain mask in regions in said substrate, o) forming a seventh dielectric layer over the entire exposed surfaces, p) forming via openings in said seventh dielectric layer down to said second polysilicon layer, q) forming a third polysilicon layer on said device extending down into said via openings, r) forming a third polysilicon masking layer on the surface of said third polysilicon layer, and s) etching said third polysilicon layer to form a configuration through said third polysilicon masking layer.

2. A method in accordance with claim 1 wherein said first dielectric layer comprises a gate oxide layer.

3. A method in accordance with claim 1 wherein said second dielectric layer comprises a silicon dioxide layer applied by chemical vapor deposition.

4. A method in accordance with claim 1 wherein said third dielectric layer comprises a silicon dioxide layer.

5. A method in accordance with claim 1 wherein said fourth dielectric layer comprises a second gate oxide layer.

6. A method in accordance with claim i wherein said fifth dielectric layer comprises a silicon dioxide layer applied by chemical vapor deposition.

7. A method in accordance with claim 1 wherein said sixth dielectric layer comprises a silicon dioxide layer.

8. A method in accordance with claim 1 wherein said seventh dielectric layer comprises a third gate oxide layer.

9. The method of claim 1 wherein an SRAM is formed by the method.

10. The method of claim 9 wherein said third polysilicon layer is the gate electrode layer of a thin film transistor used in said SRAM.

* * * * *